United States Patent [19]
Park et al.

[11] Patent Number: 5,966,614
[45] Date of Patent: Oct. 12, 1999

[54] SILICON NITRIDE-FREE ISOLATION METHODS FOR INTEGRATED CIRCUITS

[75] Inventors: Tai-su Park; Ho-kyu Kang, both of Kyungki-do, Rep. of Korea

[73] Assignee: Samsung Electronics Co., Ltd., Rep. of Korea

[21] Appl. No.: 08/934,241

[22] Filed: Sep. 19, 1997

[30] Foreign Application Priority Data

Dec. 17, 1996 [KR] Rep. of Korea ........................ 96-66948
May 3, 1997 [KR] Rep. of Korea ........................ 97-17191

[51] Int. Cl.$^6$ ................................................. H01L 21/762
[52] U.S. Cl. .......................... 438/401; 438/692; 438/959; 438/424
[58] Field of Search ..................................... 438/424, 437, 438/692, 959, FOR 111, 759, FOR 227, 975, 401, FOR 435; 148/DIG. 50

[56] References Cited

U.S. PATENT DOCUMENTS

| | | |
|---|---|---|
| 4,741,799 | 5/1988 | Chen et al. .............................. 156/643 |
| 5,275,965 | 1/1994 | Manning . |
| 5,312,770 | 5/1994 | Pasch ........................................ 437/67 |
| 5,441,094 | 8/1995 | Pasch .................................... 156/636.1 |
| 5,453,639 | 9/1995 | Cronin et al. . |

OTHER PUBLICATIONS

Fazan et al., "A Highly Manufacturable Trench Isolation Process for Deep Submicron DRAMs", IEDM 93, pp. 57–60.

Park et al., "A Very Simple Trench Isolation (VSTI) Technology With Chemo–Mechanically Polished (CMP) Substrate Si", 1997 Symposium on VLSI Technology, Jun. 10, 1997.

*Primary Examiner*—George Fourson
*Attorney, Agent, or Firm*—Myers Bigel Sibley & Sajovec

[57] ABSTRACT

Trench isolation methods for integrated circuit substrates may be simplified by eliminating the steps of forming a silicon nitride layer, etching the silicon nitride layer and removing the silicon nitride layer. In particular, a silicon nitride-free mask pattern, such as a photoresist mask pattern, may be formed on a silicon nitride-free integrated circuit substrate. The silicon nitride-free integrated circuit substrate is etched through the silicon nitride-free mask pattern to form a trench in the substrate. An insulating layer is formed in the trench and is chemical-mechanical polished to form a trench isolating layer. By eliminating the silicon nitride layer, simplified processing and improved performance may be obtained.

14 Claims, 6 Drawing Sheets

SILICON NITRIDE-FREE ISOLATION METHODS FOR INTEGRATED CIRCUITS

FIELD OF THE INVENTION

The present invention relates to isolation methods for integrated circuit devices, and more particularly to trench isolation methods for integrated circuit devices.

BACKGROUND OF THE INVENTION

As integrated circuit devices become more highly integrated and include finer geometries, it can become increasingly important to reduce the size of isolation regions that are used to isolate active devices such as transistors from one another. The initial formation of isolation regions may determine the size of an active region and the process margins for subsequent processing. Accordingly, reduction of the size of the isolation regions is desirable.

LOCal Oxidation of Silicon (LOCOS) is widely used for fabricating isolation regions in integrated circuits. The LOCOS process can be simple. However, in highly integrated devices, such as 256 MB DRAM devices, as the width of the isolation region is reduced, a punchthrough may be caused by "bird's beak" during oxidation. This may reduce the thickness of a field oxide film and may reduce the size of the active regions.

An isolation method may also use a trench, rather than forming a field oxide layer by thermal oxidation. In trench isolation methods, a trench is formed on the integrated circuit device and is filled with an insulating material such as an oxide layer, to thereby form an isolation region that can be smaller than that formed by the LOCOS method. Moreover, problems of the LOCOS method and problems caused by the thermal oxidation can be controlled.

A trench isolation method is disclosed in "A Highly Manufacturable Trench Isolation Process for Deep Submicron DRAMs", IEDM Tech. Digest, pp. 57–60, 1993, by P. Fazan et al. As disclosed, a pad oxide layer and a silicon nitride layer are formed and patterned on an integrated circuit substrate. The integrated circuit substrate is then etched using the patterned silicon nitride layer and pad oxide layer as a mask, to form a trench. Then, a sidewall of the trench is thermally oxidized, and an oxide layer is formed in the trench by chemical vapor deposition. The oxide layer is then planarized by Chemical Mechanical Polishing (CMP). Subsequently, the silicon nitride layer is removed, and an oxide spacer is formed on the sidewall of the oxide layer. The pad oxide layer is then wet etched to complete an isolation layer and to form a gate oxide layer and a gate.

FIG. 1 illustrates fabrication steps for conventional trench isolation methods. As shown in FIG. 1, in a conventional trench isolation method, a pad oxide layer is formed on an integrated circuit substrate, such as a semiconductor substrate, at Block 10. A silicon nitride layer is then formed on the pad oxide layer at Block 12. A photoresist layer is formed on the silicon nitride layer at Block 14. The photoresist layer is patterned by conventional methods to form a photoresist mask pattern.

Continuing with the description of FIG. 1, at Block 16, the silicon nitride layer is patterned using the patterned photoresist as a mask. The photoresist is then removed at Block 18. The silicon nitride layer is then used to form a trench at Block 20. An insulating layer is formed in the trench and on the substrate, to thereby bury the trench, at Block 22. Chemical-mechanical polishing is then used to planarize the trench at Block 24. The silicon nitride layer is then removed at Block 26. The details of conventional trench isolation are well known to those having skill in the art, and need not be described further herein.

SUMMARY OF THE INVENTION

The present invention can simplify trench isolation methods for integrated circuits and can also provide improved performance of integrated circuits by eliminating the steps of forming a silicon nitride layer on an integrated circuit substrate, etching the silicon nitride layer through a mask pattern and then removing the silicon nitride layer after a trench is formed. By eliminating the formation, etching and removal of silicon nitride, simplified trench isolation methods may be provided. Moreover, it has been found that improved performance may be obtained by trench isolation structures so formed.

In particular, according to the present invention, a silicon nitride-free mask pattern is formed on a silicon nitride-free integrated circuit substrate. The silicon nitride-free integrated circuit substrate is etched through the silicon nitride-free mask pattern to form a trench in the substrate. An insulating layer is formed in the trench, and the insulating layer is chemical-mechanical polished to form a trench isolating layer in the trench.

The silicon nitride-free mask pattern may be removed from the silicon nitride-free integrated circuit after the trench is formed and before the insulating layer is formed in the trench. The insulating layer may be formed by forming an insulating layer on the silicon nitride-free integrated circuit substrate including in the trench and then chemical-mechanical polishing the insulating layer from on the silicon nitride-free integrated circuit substrate.

The silicon nitride-free mask pattern may be a photoresist mask pattern. The photoresist mask pattern may be formed on a bare semiconductor substrate, that is a semiconductor substrate that does not include any layers on the face thereof. The mask pattern may also be an oxide mask pattern that is formed on the bare semiconductor substrate. Photoresist may be used to pattern the oxide mask pattern.

After the chemical-mechanical polishing step, an oxide layer may be formed on the isolating layer and ions may be implanted through the oxide layer. The ions may be used to form wells and channel stops and to control the threshold voltage of devices that are subsequently formed.

After chemical-mechanical polishing, a step may be formed between the isolation layer and the integrated circuit substrate, to thereby form an alignment key for subsequent processing. The step may be formed by etching the isolation layer to thereby recess the isolation layer relative to the integrated circuit substrate. Alternatively, the integrated circuit substrate may be etched, to thereby recess the integrated circuit substrate relative to the isolation layer.

In alternate aspects of the present invention, prior to the step of forming an insulating layer in the trench, a thermal oxide lining may be formed in the trench. Moreover, thermal treatment may be performed on the insulating layer after it is formed in the trench.

Accordingly, conventional trench isolation methods for integrated circuits are improved by eliminating silicon nitride layers. Simplified processing and improved performance may thus be obtained.

DETAILED DESCRIPTION OF PREFERRED EMBODIMENTS

Figure 1:
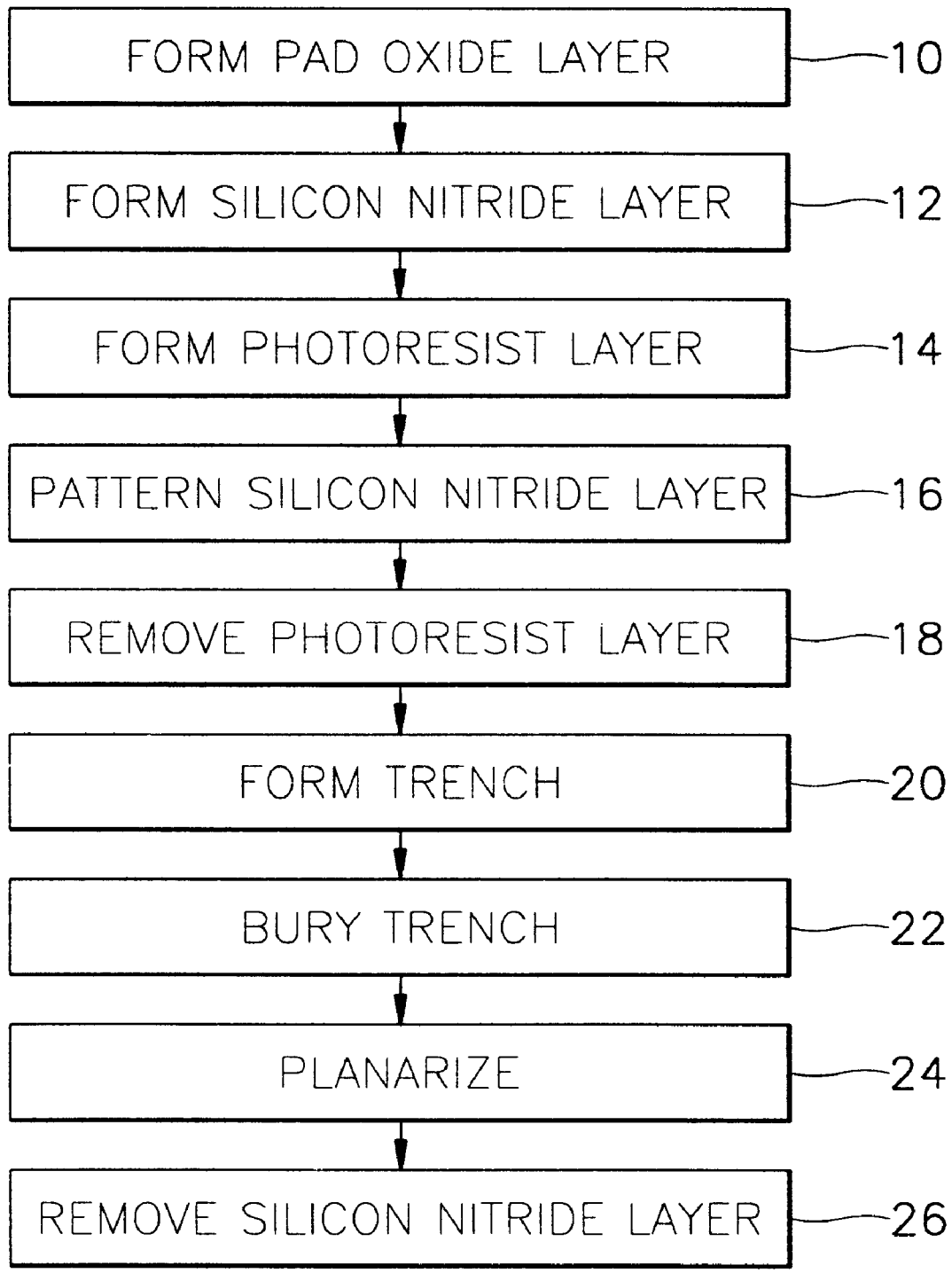
FIG. 1 is a block diagram sequentially showing conventional trench isolation methods.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity type embodiment as well. It will also be understood that when a layer or region is referred to as being "on" another layer, region or substrate, it can be directly on the other layer, region or substrate, or intervening layers or regions may also be present. Conversely, when a layer or region is indicated as being "directly on" another layer, region or substrate, intervening layers or regions are not present.

Figure 2:
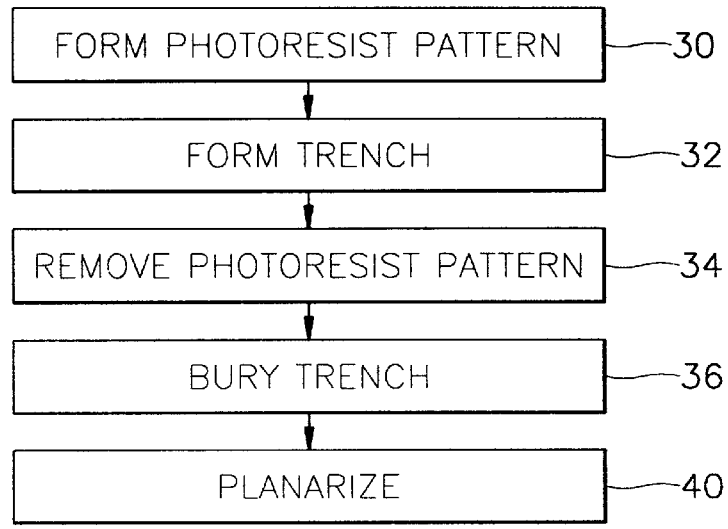
FIG. 2 is a block diagram sequentially showing trench isolation methods according to the present invention.

FIG. 2 is a block diagram of trench isolation methods according to the present invention. In sharp contrast with the methods of FIG. 1, the methods of FIG. 2 include a first step of forming a photoresist pattern (Block 30), a second step of forming a trench (Block 32), a third step of removing the photoresist pattern (Block 34), a fourth step of burying a trench with an insulating material (Block 36), and a fifth step of planarization (Block 38). Since the trench may be formed in the substrate using only a photoresist pattern, up to four steps of FIG. 1 may be eliminated. That is, the steps of forming a pad oxide layer (Block 10), forming a silicon nitride layer (Block 12), patterning a silicon nitride layer (Block 16), and removing the silicon nitride layer (Block 26), may be eliminated. Accordingly, fabrication of integrated circuit devices may be simplified, which can reduce device cost.

First through third embodiments of the present invention according to the overall methods of FIG. 2 will now be described with reference to FIGS. 3 through 11.

Figure 3:
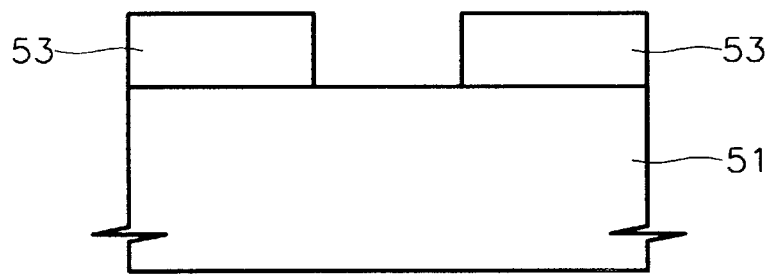
FIGS. 3 through 6 are cross-sectional views of integrated circuits, illustrating trench isolation methods according to a first embodiment of the present invention.

FIG. 3 shows a step of forming a mask pattern 53 on a semiconductor substrate 51. The semiconductor substrate 51 is covered with a material used for an etching mask, for example, photoresist, to form a photoresist layer. The photoresist layer is then patterned until part of the substrate is exposed, to form a mask pattern 53.

According to a preferred embodiment, before forming the mask pattern 53, a thin thermal oxide layer or a silicon dioxide layer formed by chemical vapor deposition is formed, to enhance adhesion of the mask pattern 53 to the substrate 51. Also, the mask pattern 53 can be formed of silicon dioxide instead of photoresist, to allow a finer trench to be formed.

Figure 4:
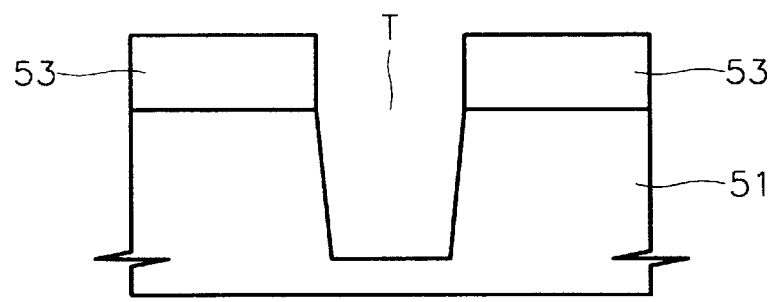

FIG. 4 shows the step of forming a trench T. The trench T is formed by etching the substrate 51 to a predetermined depth using the mask pattern 53 as an etch mask.

Figure 5:
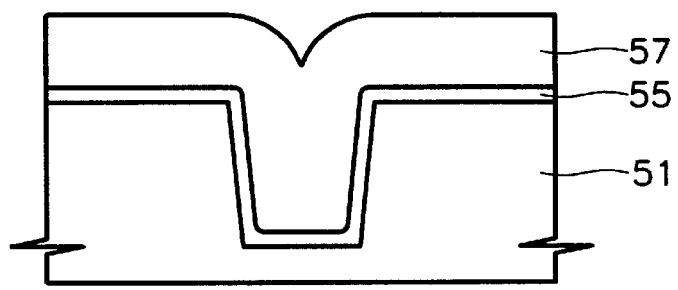

FIG. 5 shows a step of forming an insulating layer 57. If the mask pattern 53 is formed of photoresist, the mask pattern 53 may be removed by a conventional step such as photoresist ashing. Then, the insulating layer 57 having a predetermined thickness is formed on the substrate 51, including in the trench, to bury the trench. The insulating layer 57 can be formed of undoped silicon glass (USG), for example, by chemical vapor deposition using high density plasma. Alternatively, if the mask pattern 53 is formed of silicon dioxide, the mask pattern 53 may be removed before forming the insulating layer 57 or during subsequent planarization of the insulating layer 57.

According to another aspect of the present invention, a thermal oxide layer 55 having a thickness of approximately 50~250 Å can be formed on the entire surface of the substrate 51, including lining the trench, before forming the insulating layer 57. The thermal oxide layer 55 can remove defects and stress in the substrate 51, that may be generated during plasma etching for forming the trench.

According to another aspect of the present invention, after forming the of the insulating layer 57, a thermal treatment can be performed at 700~1200° C., and preferably 1000° C., in an atmosphere of nitride ($N_2$) for 30 min~16 hours, and preferably approximately 1 hour. The thermal treatment can improve the integrity of the insulating layer 57.

Figure 6:
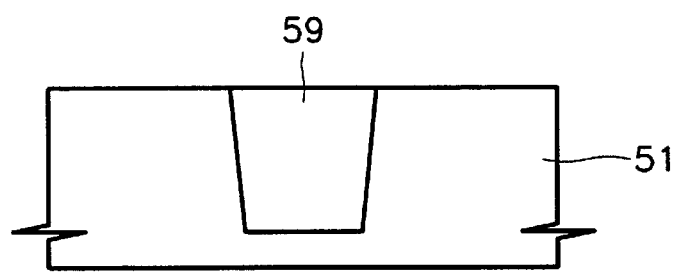

FIG. 6 shows a step of forming an isolation layer 59 from the insulating layer 57. Chemical-Mechanical Polishing (CMP) is performed until the semiconductor substrate 51 is exposed, to planarize the insulating layer 57. Accordingly, an isolation layer 59 that buries the trench is formed. Then, a sacrificial oxide layer may be grown to a thickness of 50~200 Å through a conventional sacrificial oxidation process. Ion-implantation of impurities, for example, ion implantation for wells, channel stops, or threshold voltage control, may be performed. Then, the sacrificial oxide layer may be removed using a silicon oxide layer etchant such as buffered oxide etchant (BOE) or hydrofluoric acid (HF).

Figure 14:
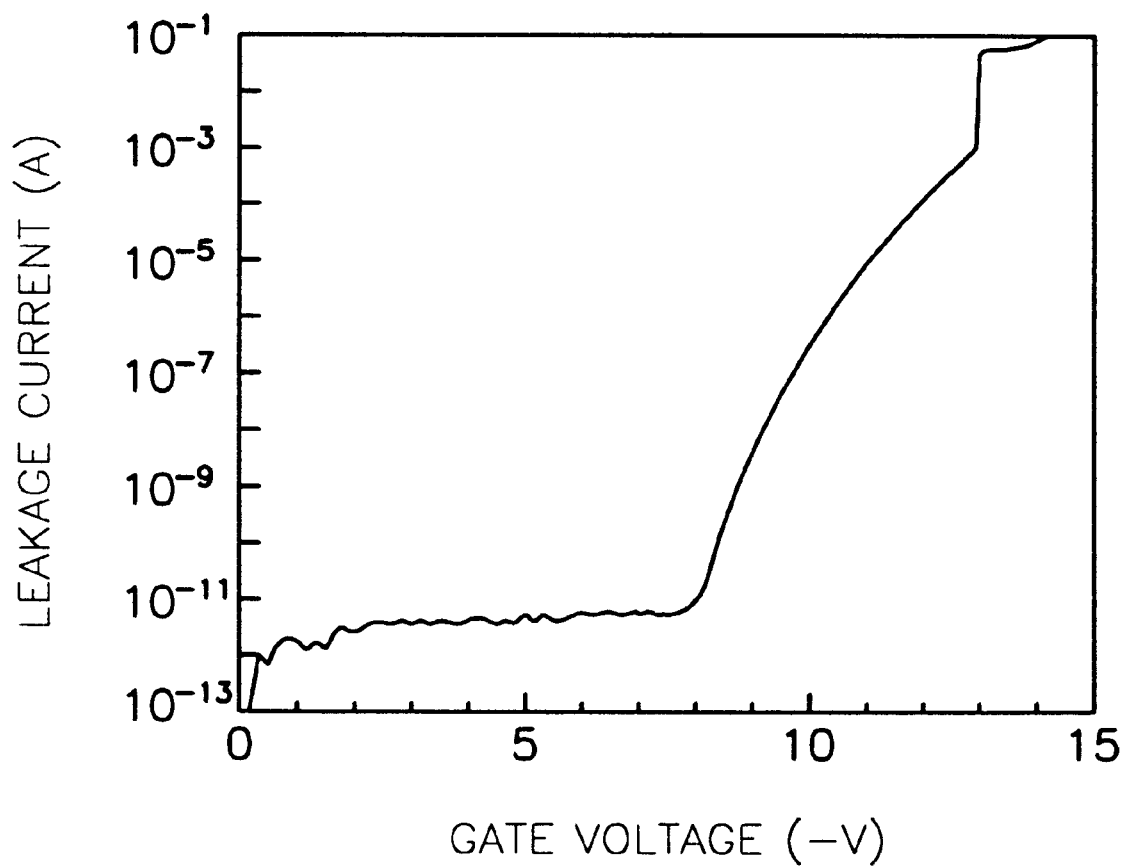

The sacrificial oxidation process can reduce defects or damage on the surface of the substrate, that may be generated during the CMP process, to encourage later growth of a high quality gate oxide layer. FIG. 14 graphically illustrates leakage current characteristics of a gate oxide layer formed after trench isolation according to this aspect of the present invention.

As described above, according to a first embodiment of the present invention, the trench is formed in the substrate using photoresist as a mask, and the mask is removed after forming the trench. Therefore, the steps of growing a pad oxide layer, depositing a nitride layer, etching to form the mask patterns and removing the nitride layer, which are practiced in conventional processes, may be eliminated. Accordingly, isolation layer formation may be simplified.

Figure 7:
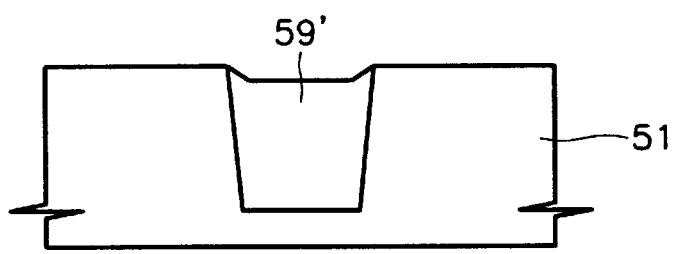
FIGS. 7 through 9 are cross-sectional views of integrated circuits, illustrating trench isolation methods according to a second embodiment of the present invention.
Figure 8:
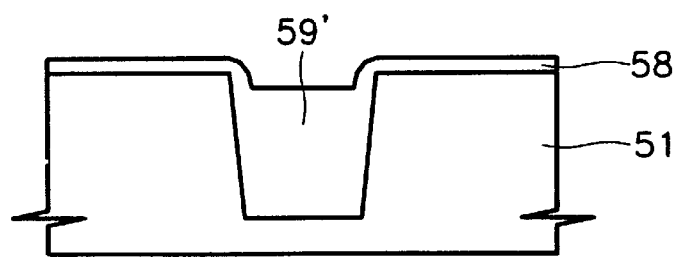
Figure 9:
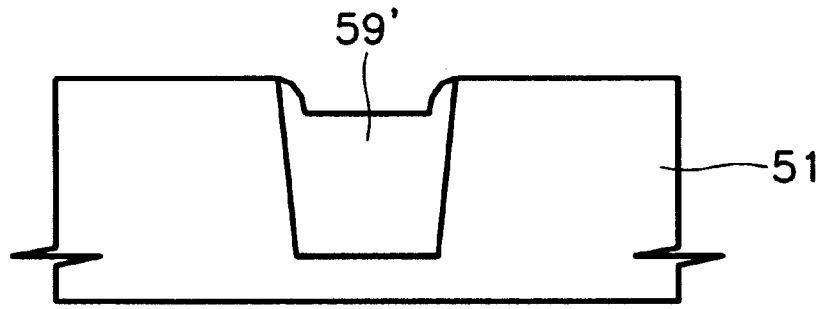

FIGS. 7 through 9 are cross-sectional views illustrating trench isolation methods according to a second embodiment of the present invention. The second embodiment is performed in the same way as the first embodiment except that the isolation layer is recessed more deeply than the substrate adjacent thereto, after the CMP process.

In particular, FIG. 7 shows a step of forming an isolation layer 59' having a recessed surface. An insulating layer 57 is formed, and the insulating layer 57 is planarized by CMP until the semiconductor substrate 51 is exposed, as in the first embodiment, to form an isolation layer 59. Then, the isolation layer 59 is etched to a predetermined thickness, to form an isolation layer 59' that is recessed below the surface of the substrate 51. Thus, a step is formed between the isolation layer 59' and the substrate 51 adjacent thereto. The etching may be performed by wet etching using an etchant capable of selectively etching the isolation layer 59. For example, a mixed solution of $HNO_3$, $NH_4OH$ and $H_2O_2$ or an oxide etchant such as HF, may be used. Alternatively, dry etching using plasma may be employed.

The step difference between the surface of the isolation layer 59' formed by etching and the surface of the substrate 51, is preferably 100~1000 Å. The step difference may be used as an alignment key for subsequent processing, for example, subsequent photolithographic processes that form a gate electrode.

In conventional trench isolation methods, since planarization after the CMP process is attained, the final structure generally has little step difference. A separate alignment key pattern for subsequent processes may need to be formed. In contrast, in the second embodiment, a step difference is formed so that the additional process of forming an alignment key may be omitted.

As shown in FIGS. 8 and 9, a sacrificial oxidation process is additionally performed on the entire surface of the substrate, including in the trench, where the recessed isolation layer 59' is formed, to grow a sacrificial oxide layer 58 to a thickness of 50~200 Å. Then, ion-implantation of impurities, for example, ion implantation for wells, channel stops, or threshold voltage control, is performed. Then, the sacrificial oxide layer 58 may be removed using a silicon oxide layer etchant such as buffered oxide etchant (BOE) or hydrofluoric acid (HF), to complete the isolation layer 59'.

According to the above-described second embodiment, the isolation layer is selectively etched to form a step between the isolation layer and the substrate, which can be used as an alignment key for subsequent processing. Accordingly, the fabrication process can be simplified.

Figure 10:
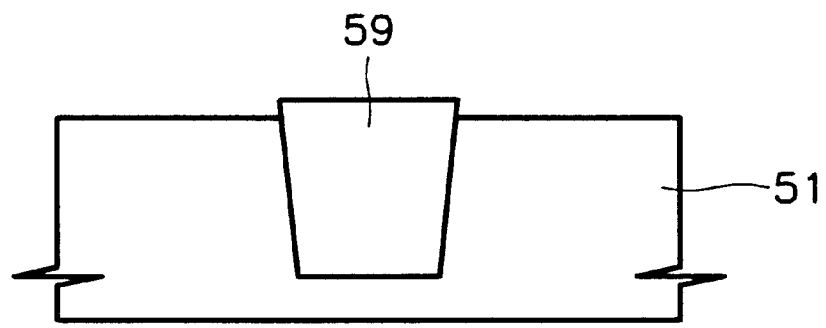
FIGS. 10 and 11 are cross-sectional views of integrated circuits, illustrating trench isolation methods according to a third embodiment of the of the present invention.
Figure 11:
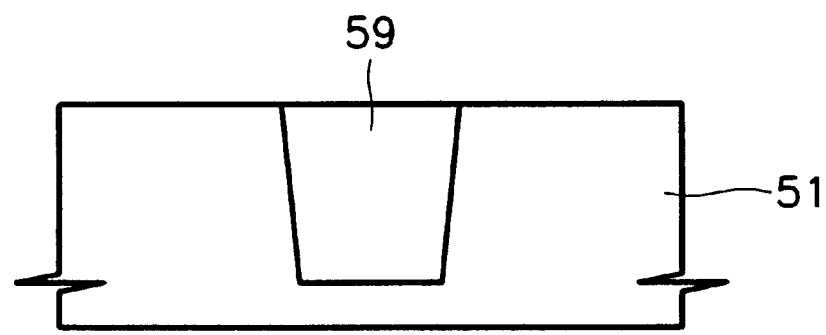

FIGS. 10 and 11 are cross-sectional views illustrating trench isolation methods according to a third embodiment of the present invention. The third embodiment of the present invention is performed in the same manner as the first embodiment except the substrate 51 is recessed more deeply than the isolation layer 59, after the CMP.

In particular, FIG. 10 shows a step of etching the surface of the semiconductor substrate 51 to recess the substrate. The insulating layer 57 is formed, and planarized by CMP until the semiconductor substrate 51 is exposed, in the same manner as the first embodiment. Then, the substrate 51 is selectively etched to a predetermined depth by wet etching using an etchant capable of etching only the substrate, for example, a mixed solution of $NH_4F$ and HF.

Accordingly, the surface of the substrate 51 is recessed below the surface of the isolation layer 59. A step between the substrate and the isolation layer is created. The substrate etching may reduce stress generated during the CMP. It may also remove defects and/or particles from the slurry used for the CMP process, from the substrate surface.

FIG. 11 shows a step of forming an isolation layer that is planarized after sacrificial oxidization. A sacrificial oxide layer is grown by sacrificial oxidation to a thickness of 50~400 Å on the entire surface of the substrate which was recessed as in FIG. 10. Ion-implantation of impurities, for example, ion implantation for forming wells and channel stops, or threshold voltage control, is performed. Then the sacrificial oxide layer may be removed using an oxide layer etchant such as buffered oxide etchant (BOE) or hydrofluoric acid (HF), to complete the isolation layer 59.

Etching or over-etching may be performed. When over-etching, the sacrificial oxide layer is removed, to planarize the surface of the substrate 51 and the surface of the isolation layer 59. When etching without over-etching, the substrate 51 is etched until a step difference of 100~1000 Å exists between the surface of the isolation layer and the surface of the substrate. The step difference can be used as an alignment key in a subsequent process.

In the above-described third embodiment, the process may be simplified as in the first embodiment. The semiconductor substrate is also selectively etched after the CMP, to thereby reduce damage or contamination of the semiconductor substrate due to the CMP. Also, as with the second embodiment, the step difference between the surface of the isolation layer and the surface of the substrate can be used as an alignment key in a subsequent process, to simplify subsequent processing.

Figure 12:
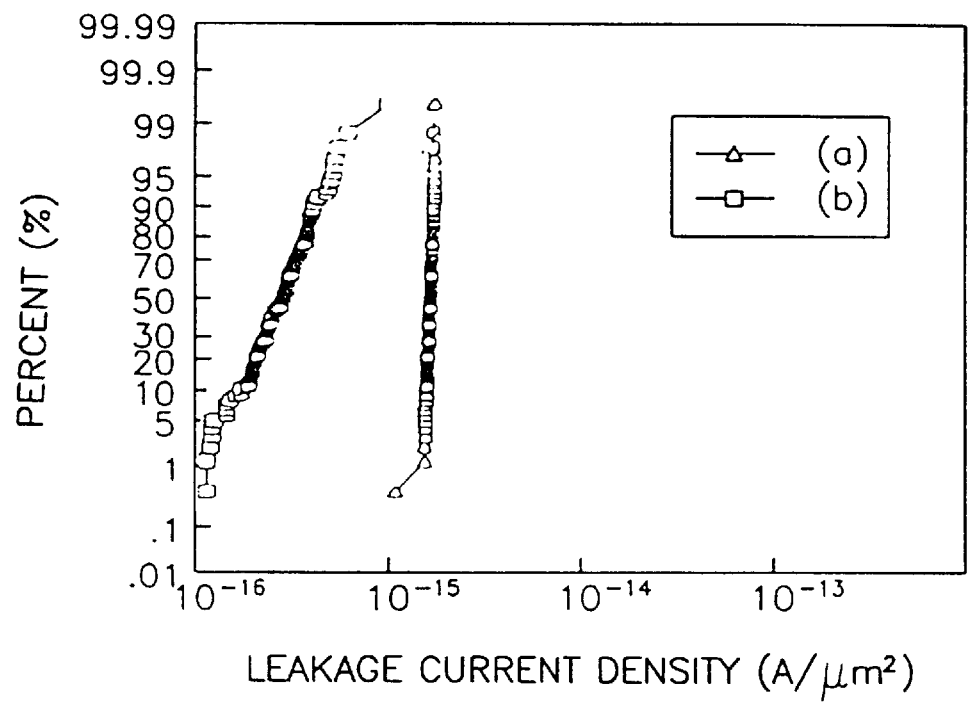
FIGS. 12 through 14 are graphs showing electrical characteristics of devices formed using trench isolation methods according to the first embodiment of the present invention.
Figure 13:
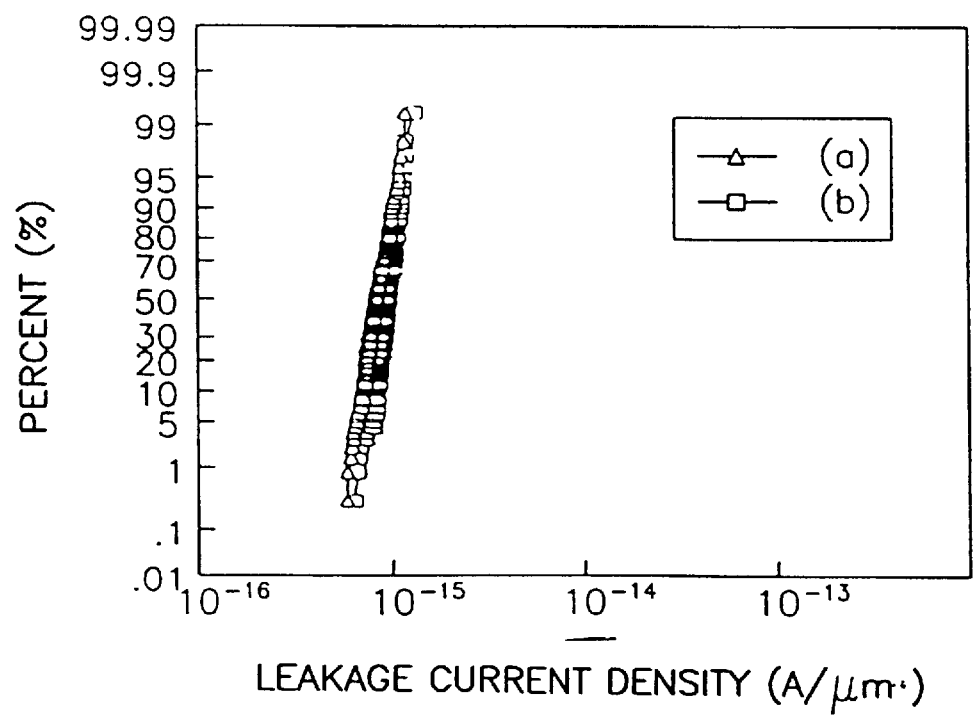

FIGS. 12 and 13 show leakage current density at a p-n junction. FIG. 12 shows leakage current density at a p-n junction for a rectangular active pattern, and FIG. 13 shows leakage current density for a plurality of linear active patterns. Reference character a represents a conventional method in which the trench is formed using a conventional silicon nitride layer pattern as a mask. Reference character b represents a method in which the photoresist pattern according to the present invention is used as an etch mask. As shown, the leakage current density at the p-n junction region according to the present invention is lower than according to the conventional art (see FIG. 12) or similar to the conventional art (see FIG. 13).

FIG. 14 is a graph of gate oxide layer characteristics, which shows current-voltage characteristics of a MOS capacitor, after forming a gate oxide layer and a gate electrode. FIG. 14 shows a very good current-voltage curve, and shows that electrical characteristics of devices are not influenced by the CMP process that is performed until the substrate surface is exposed.

According to the above present invention, processes which are used in the conventional art may be eliminated. In particular, the steps of forming a pad oxide layer and a nitride layer, and patterning and removing these layers after a CMP process may be eliminated. Therefore, the fabrication process can be simplified, to thereby reduce integrated circuit cost.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A trench isolation method for an integrated circuit comprising the steps of:

forming a photoresist mask pattern directly on a bare semiconductor substrate;

etching the bare semiconductor substrate through the photoresist mask pattern, to form a trench in the substrate;

forming an insulating layer in the trench;

chemical-mechanical polishing the insulating layer to form a trench isolating layer in the trench; and forming a step between the isolation layer and the semiconductor substrate by etching the isolation layer to thereby recess the isolation layer relative to the semiconductor substrate.

2. A method according to claim 1 wherein the following steps are performed after the step of chemical-mechanical polishing:

forming an oxide layer on the isolating layer;

implanting ions through the oxide layer; and removing the oxide layer.

3. A method according to claim 1 wherein the following step is performed prior to the step of forming an insulating layer in the trench:

forming a thermal oxide lining in the trench.

4. A method according to claim 1 wherein the following step is performed after the step of forming an insulating layer in the trench:

thermally treating the insulating layer.

5. A method according to claim 1 wherein the following step is performed between the steps of etching the bare semiconductor substrate and forming an insulating layer:

removing the photoresist mask pattern from the bare semiconductor substrate.

6. A method according to claim 5, wherein the step of forming an insulating layer comprises the step of forming an insulating layer on the bare semiconductor substrate including in the trench; and wherein the step of chemical-mechanical polishing comprises the step of chemical-mechanical polishing the insulating layer from on the bare semiconductor substrate.

7. A trench isolation method for an integrated circuit comprising the steps of:

forming a photoresist mask pattern directly on a bare semiconductor substrate;

etching the bare semiconductor substrate through the photoresist mask pattern, to form a trench in the substrate;

forming an insulating layer in the trench;

chemical-mechanical polishing the insulating layer to form a trench isolating layer in the trench; and forming a step between the isolation layer and the semiconductor substrate by etching the semiconductor substrate to thereby recess the semiconductor substrate relative to the isolation layer.

8. A method according to claim 7 wherein the following steps are performed after the step of chemical-mechanical polishing:

forming an oxide layer on the isolating layer;

implanting ions through the oxide layer; and removing the oxide layer.

9. A method according to claim 7 wherein the following step is performed prior to the step of forming an insulating layer in the trench:

forming a thermal oxide lining in the trench.

10. A method according to claim 7 wherein the following step is performed after the step of forming an insulating layer in the trench:

thermally treating the insulating layer.

11. A method according to claim 7 wherein the following step is performed between the steps of etching the bare semiconductor substrate and forming an insulating layer:

removing the photoresist mask pattern from the bare semiconductor substrate.

12. A method according to claim 11 wherein the step of forming an insulating layer comprises the step of forming an insulating layer on the bare semiconductor substrate including in the trench; and wherein the step of chemical-mechanical polishing comprises the step of chemical-mechanical polishing the insulating layer from on the bare semiconductor substrate.

13. A trench isolation method for an integrated circuit comprising the steps of:

forming an oxide layer on a semiconductor substrate;

forming a photoresist mask pattern on the oxide layer, wherein the oxide layer enhances adhesion between the substrate and the photoresist mask pattern;

etching the oxide layer and the semiconductor substrate through the photoresist mask pattern, to form a trench in the substrate;

forming an insulating layer in the trench;

chemical-mechanical polishing the insulating layer to form a trench isolating layer in the trench; and forming a step between the isolation layer and the semiconductor substrate by etching the semiconductor substrate to thereby recess the semiconductor substrate relative to the isolation layer.

14. A trench isolation method for an integrated circuit comprising the steps of:

forming an oxide layer on a semiconductor substrate;

forming a photoresist mask pattern on the oxide layer, wherein the oxide layer enhances adhesion between the substrate and the photoresist mask pattern;

etching the oxide layer and the semiconductor substrate through the photoresist mask pattern, to form a trench in the substrate;

forming an insulating layer in the trench;

chemical-mechanical polishing the insulating layer to form a trench isolating layer in the trench; and forming a step between the isolation layer and the semiconductor substrate by etching the isolation layer to thereby recess the isolation layer relative to the semiconductor substrate.

* * * * *